United States Patent [19]

Preston

[11] 4,057,663

[45] Nov. 8, 1977

[54] PROCESS FOR TREATING HYDROPHOBIC SURFACES

[75] Inventor: John M. Preston, Lynchburg, Va.

[73] Assignee: General Electric Company, Lynchburg, Va.

[21] Appl. No.: 713,149

[22] Filed: Aug. 10, 1976

[51] Int. Cl.² .......................................... C23C 3/02
[52] U.S. Cl. ................................ 427/307; 427/304; 427/305; 427/322; 427/400; 204/30; 204/38 B
[58] Field of Search ............... 427/400, 307, 304, 305, 427/306, 407 C, 407 E, 407 F, 407 G, 322; 428/422; 204/30, 38 B

[56] References Cited

U.S. PATENT DOCUMENTS

| | | | |
|---|---|---|---|
| 3,471,313 | 10/1969 | Saubestre et al. | 427/307 X |
| 3,598,630 | 8/1971 | Doty et al. | 427/307 X |
| 3,689,292 | 9/1972 | Preston | 106/1 |
| 3,905,877 | 9/1975 | Deyrup | 204/30 |
| 3,983,267 | 9/1976 | Norris | 427/304 X |

OTHER PUBLICATIONS

Kendall, Smith's College Chemistry, pp. 428, 429.

*Primary Examiner*—Ralph S. Kendall
*Attorney, Agent, or Firm*—James J. Williams

[57] ABSTRACT

A process treats a normally hydrophobic polymeric surface with a special phosphoric acid composition having a $P_2O_5$ concentration of 70-82% to make the polymeric surface hydrophilic and thus receptive to metal coatings. The process is especially suitable for surfaces of fluorocarbon polymers, such as tetrafluoroethylene and trifluorochloroethylene, and copolymers of tetrafluoroethylene and hexafluoropropylene.

9 Claims, No Drawings

PROCESS FOR TREATING HYDROPHOBIC SURFACES

BACKGROUND OF THE INVENTION

This invention relates to a process for treating the hydrophobic surface of a polymeric material, and particularly to such a process for making the surface wettable and hence receptive to electroless metal coatings.

Many polymeric materials such as the fluorocarbons have hydrophobic surfaces which do not form a strong bond with a metal coating or plating. Hence, the hydrophobic surface must be either mechanically or chemically treated to obtain better adhesion between the polymeric surface and the metal coating. An example of such material is Teflon ®, a DuPont trademark for tetrafluoroethylene resins. Teflon material is used because of its good electrical properties, chemical inertness, substantially zero moisture absorption, low coefficient of friction, and resistance to adhesion.

The prior art discloses many processes for treating hydrophobic surfaces of polymeric materials to make them adherent to metal coatings. One of those processes treats the polymeric surface with a sodium dispersion in napthalene. The sodium dispersion treatment is very expensive and has a very short useful life.

Other processes mechanically abrade the surface of the polymers, or etch the surfaces of the polymers with various acids.

One of the prior art processes relating to the treating of a polymeric surface to make it hydrophilic is taught in U.S. Pat. No. 3,471,313. That patent discloses a process for imparting a hydrophilic surface to polymers by treating the polymeric surface with an acid solution consisting of chromic acid and orthophosphoric acid. When a polymeric surface is so treated and then coated or plated with a metal, the result is an average bond strength between the metal plate and the surface of 4½ pounds per inch of width. This strength is considerably less than highly unexpected bond or peel strength of 16-20 pounds per inch of width as will be discussed hereinafter. And even when orthophosphoric acid ($H_3PO_4$) is boiled to produce polyphosphoric acid, the polyphosphoric acid does not make a polymeric surface appreciably more wettable.

U.S. Pat. No. 3,629,922 discloses that various plastics such as poly (haloethylenes) can be plated with metals by pretreatment with a compound, such as trihydroxymethyl phosphine.

U.S. Pat. No. 3,748,109 teaches the production of superconductors by applying, to a substrate of polytetrafluoroethylene, a low oxidation state phosphorous compound, applying a resist, removing the unprotected metal phosphorous compound, dissolving the resist, and subjecting the substrate to electroless or electrolytic treatment.

The use of phosphoric acid having a high $P_2O_5$ content is known in electroless plating compositions as shown by Applicant's U.S. Pat. No. 3,689,292. The patent is directed to the treatment of a solder plate on a base metal to produce a lustrous adherent tin plate.

Applicant also has a pending U.S. patent application, Ser. No. 638,829, filed Dec. 8, 1975, now U.S. Pat. No. 4,014,715 relating to a solder cleaning and coating composition. The cleaning composition comprises a mineral acid, a phosphoric acid concentrate having a $P_2O_5$ content of about 72-76%, formed by heating 54% phosphoric acid with a mono- or polysaccharide, a dibasic acid such as succinic acid, and thiourea. A wetting agent, such as Triton X-100 manufactured by Rohm and Haas, is also incorporated in the composition. Other similar wetting agents may be satisfactory.

To Applicant's knowledge, none of the prior art shows a process for treating a polymeric surface to make it wettable, that uses a modified pyro-phosphoric acid concentrate having a $P_2O_5$ concentration of 70-82% (hereinafter referred to as MPA concentrate). Such MPA concentrates of Applicant have the formula $R_4P_2O_7$ wherein R may be hydrogen.

SUMMARY OF THE INVENTION

A primary object of my invention therefore is to provide an improved method of treating hydrophobic surfaces of polymers to make them hydrophilic and receptive to electroless metal coatings.

Another object is to treat the surface of the polymeric material with an MPA concentrate.

A further object is to treat hydrophobic polymeric surfaces with an MPA concentrate to render the subsequent polymeric surface hydrophilic so that it can be readily wetted by electroless copper, or nickel, or other metallizing solutions and thereby provide an unusually high peel strength between the deposited metal and polymeric surface.

Briefly stated, this invention relates to a method of treating the hydrophobic surface of a polymeric material, especially the fluorocarbon polymers, with an MPA concentrate having a $P_2O_5$ content of about 70-82%. The MPA concentrate is prepared by heating an ortho-phosphoric acid containing 54.5% $P_2O_5$ with 1-5% of a monosaccharide or polysaccharide such as sucrose, maltose, glucose, fructose, lactose or mannose at a temperature of about 150° C. to concentrate the mixture to 70-82% $P_2O_5$. This concentrate, after heating, contains about 0.2% of succinic acid and small amounts of organic phosphates and succinates. Phosphoric acid that has a $P_2O_5$ content between 70-82% or intermediate ranges of 72-76% or 75-80% may be used, if reacted with a sugar saccharide as described above.

In the preparation or conditioning of the surface of a polymer or copolymer, the polymeric (plastic) material is treated with acid whose concentration is 100% MPA at a temperature of about 100°-140° C. for a period of at least about ten minutes. Longer periods do not seem to improve the process. However, if lower temperatures must be used, these longer periods may be necessary. This treatment will produce a wettable or hydrophilic polymeric surface.

The polymeric surface may take the form of fibers, filaments, sheets, coated wires, or cables, or any other shape or form.

DETAILED DESCRIPTION

In addition to the fluorocarbon polymers, Applicant's process may be used to treat other hydrophobic polymeric or copolymeric surfaces to make them wettable or hydrophilic. Typical polymers to which the process of this invention are applicable include phenolic resins; urea formaldehyde; polyester and alkyd polymers such as unsaturated polyesters of disbasic acids and dihydroxy compounds; vinyl resins such as acryloids including methacrylate, methyl methacrylate, and ethyl methacrylate; epoxy resins; butadiene copolymers including styrene and acrylonitrile; ethylenically unsaturated aliphatic, alicyclic and aromatic hydrocarbon polymers, such as polyethylene and polypropylene; polystyrenes; and polycarbonates.

Applicant's process is directed to the treatment of the hydrophobic surface of a polymeric material to make it hydrophilic to electroless copper plating baths, such as MacDermid Corporation's 9030. The preferred polymeric surface treating material is Applicant's MPA concentrate having a $P_2O_5$ concentration of 70–82%. The formula for the class of phosphoric acids or compounds utilized by Applicant is $R_4P_2O_7$.

The following is an example of the procedure to be followed in treating and then plating a polymeric surface:

1. Contact the polymeric material with an alkaline cleaner solution for a period of 1–3 minutes at a temperature of about 60° C.;
2. Water rinse the polymeric material for a period of 1–3 minutes, with an overflow of spray, at a temperature of 21°–49° C.;
3. Immerse the polymeric material in a MPA concentrate having a $P_2O_5$ concentration of 70–82% at a temperature of 100° – 140° C. for a period of ten minutes to eight hours;
4. Water rinse the polymeric material for a period of 1–3 minutes, as in step 2, but with a different rinse;
5. Plate electrolessly the polymeric material with a suitable metal.

An option after step 2 is to treat the polymeric material with an ammonium persulfate solution, and then water rinse it. After the polymeric material has been immersed in the MPA concentrate as in step 3, it may be dipped in hydrochloric acid for 1–3 minutes followed by the water rinse of step 4. Step 5 may include an electroless copper plating bath such as Shipley's CP-74 bath, or others. This can be followed by electroplating if desired.

A polymeric material surface made wettable and then metal plated, using my process, possesses an unusually high and unexpected peel strength (up to 20 pounds per inch of width) as contrasted with the prior art peel strength (below 5 pounds per inch of width). Bond or peel strengths provided by my process were determined by tests outlined in the Institute of Printed Circuits "Test Methods Manual". The test apparatus engages a one inch wide strip of the metal plating and pulls it perpendicularly from the polymeric surface at a rate of 2 inches per minute. Samples of two brands of Teflon material were each treated by my process for the indicated immersion times in my MPA concentrate. Each sample was then electrolessly plated with copper. After plating, the samples were heated to the various indicated temperatures and for the indicated times to cure them. The cured samples were tested with the following results:

| Teflon Brand | Immersion Time in MPA Concentrate- Minutes | Curing Time- Minutes | Curing Temperature ° C. | Peel Strength- Pounds per Inch of Width |
|---|---|---|---|---|
| Minnesota Mining | 10 | 10 | 50 | 16.2 |
| Minnesota Mining | 10 | 10 | 100 | 16.2 |
| Minnesota Mining | 10 | 20 | 50 | 20.0 |
| Minnesota Mining | 10 | 20 | 100 | 20.0 |
| Chase Keene Foster | 10 | 10 | 50 | 12.7 |
| Chase Keene Foster | 10 | 10 | 100 | 12.7 |
| Chase Keene Foster | 10 | 20 | 50 | 12.7 |
| Chase Keene Foster | 10 | 20 | 100 | 12.7 |
| Chase Keene Foster | 10 | 20 | 100 | 20.0 |

In the last example, the treated Teflon material was marbelized. After immersion in my MPA concentrate, the material was allowed to stand in open air for about 12 hours before it was plated. This indicates that my process permits considerable time between when the polymeric material is treated with the MPA concentrate and when the material is subsequently plated.

While I have given only one example of a process using my invention, persons skilled in the art will appreciate that modifications may be made to my process without departing from the spirit of the invention, or from the scope of the claims.

What I claim as new and desire to secure by Letters Patent of the United States is:

1. A process for making the hydrophobic surface of a polymeric material hydrophilic which comprises treating the polymeric surface with an MPA concentrate having a $P_2O_5$ concentration of 70–82%.
2. The process of claim 1 wherein the polymeric material is a fluorocarbon.
3. The process of claim 1 wherein the polymeric material is selected from the group consisting of the polymers of tetrafluoroethylene and trifluorochloroethylene, and from the copolymers of tetrafluoropropylene and hexfluoropropylene.
4. The process of claim 1 wherein the polymeric and copolymeric materials are selected from the group consisting of phenolic resins; urea formaldehyde resins; polyester and alkd polymers of unsaturated polyesters of dibasic acids and dihydroxy compounds; vinyl resins; acryloid polymers; epoxy resins; butadiene copolymers of styrene and acrylonitrile; ethylenically unsaturated aliphatic, alicyclic and aromatic hydrocarbon polymers; polystyrenes; and polycarbonates.
5. The process of claim 1 wherein the hydrophilic surface is plated with a metal.
6. The process of claim 1 wherein the hydrophilic surface is electroless plated and then electroplated.
7. A process for making the hydrophobic surface of a polymeric material hydrophilic and receptive to a metal plating which comprises:
   a. contacting the polymeric material with an alkaline cleaner solution for a period of 1–3 minutes at a temperature of about 60° C.;
   b. water rinsing the polymeric material for a period of 1–3 minutes;
   c. immersing the polymeric material in an MPA concentrate having a $P_2O_5$ concentration of 70–82% at a temperature of 100°–140° C. for a period of ten minutes to eight hours;
   d. water rinsing the polymeric material for a period of 1–3 minutes; and
   e. plating the polymeric material with a suitable metal.
8. The process of claim 7 wherein the polymeric material is electrolessly plated.
9. The process of claim 8 wherein the polymeric material is electroplated.

* * * * *